(12) United States Patent
Cassia

(10) Patent No.: US 7,868,657 B1
(45) Date of Patent: Jan. 11, 2011

(54) HIGH VOLTAGE LOGIC CIRCUITS

(75) Inventor: Marco Cassia, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/619,562

(22) Filed: Nov. 16, 2009

Related U.S. Application Data

(60) Provisional application No. 61/227,732, filed on Jul. 22, 2009.

(51) Int. Cl.
*H03K 19/00* (2006.01)
(52) U.S. Cl. .......................................... 326/59; 326/27
(58) Field of Classification Search .................... 326/21, 326/26, 27, 80–87, 59, 60
See application file for complete search history.

(56) References Cited

U.S. PATENT DOCUMENTS 6,031,394 A * 2/2000 Cranford et al. .............. 326/81
6,087,852 A * 7/2000 Briggs et al. .................. 326/68
2005/0040852 A1 * 2/2005 Mentze et al. ................ 326/81

* cited by examiner

*Primary Examiner*—Don P Le
(74) *Attorney, Agent, or Firm*—Ramin Mobarhan

(57) ABSTRACT

High voltage logic circuits that can handle digital input and output signals having a larger voltage range are described. In an exemplary design, a high voltage logic circuit includes an input stage, a second stage, and an output stage. The input stage receives at least one input signal and provides (i) at least one first intermediate signal having a first voltage range and (ii) at least one second intermediate signal having a second voltage range. The second stage receives and processes the first and second intermediate signals based on a logic function and provides (i) a first drive signal having the first voltage range and (ii) a second drive signal having the second voltage range. The output stage receives the first and second drive signals and provides an output signal having a third voltage range, which may be larger than each of the first and second voltage ranges.

25 Claims, 8 Drawing Sheets

& # x20;

HIGH VOLTAGE LOGIC CIRCUITS

CLAIM OF PRIORITY UNDER 35 U.S.C. §119

The present Application for Patent claims priority to Provisional U.S. Application Ser. No. 61/227,732, entitled "HIGH VOLTAGE LOGIC FAMILY," filed Jul. 22, 2009, assigned to the assignee hereof, and expressly incorporated herein by reference.

BACKGROUND

I. Field

The present disclosure relates generally to electronics, and more specifically to digital logic circuits.

II. Background

Digital logic circuits are widely used to implement digital functions, to interface between digital circuits and analog circuits, and for other functions. A digital logic circuit is a circuit that receives one or more digital input signals, performs a particular logic function on the digital input signal(s), and provides one or more digital output signals. A digital signal has one of multiple (typically two) possible logic values at any given moment. For example, a digital signal may have a high voltage level for logic high or a low voltage level (e.g., zero Volts (0V)) for logic low.

A digital logic circuit may be implemented with metal oxide semiconductor (MOS) transistors to obtain small size and low power dissipation. Typically, the MOS transistors are designed to handle the voltage range of the digital input signals as well as the digital output signals. However, in certain scenarios, it may be desirable to handle digital input and output signals having a larger voltage range.

DETAILED DESCRIPTION

The word "exemplary" is used herein to mean "serving as an example, instance, or illustration." Any design described herein as "exemplary" is not necessarily to be construed as preferred or advantageous over other designs.

High voltage logic circuits that can handle digital input and output signals having a larger voltage range are described herein. The high voltage logic circuits may be implemented with MOS transistors having a breakdown voltage that may be smaller than the voltage range of the digital input and output signals. The high voltage logic circuits may be used for various applications such as for interface circuits between digital circuits and analog circuits, for control circuits to turn on or off switches, etc.

Figure 1:
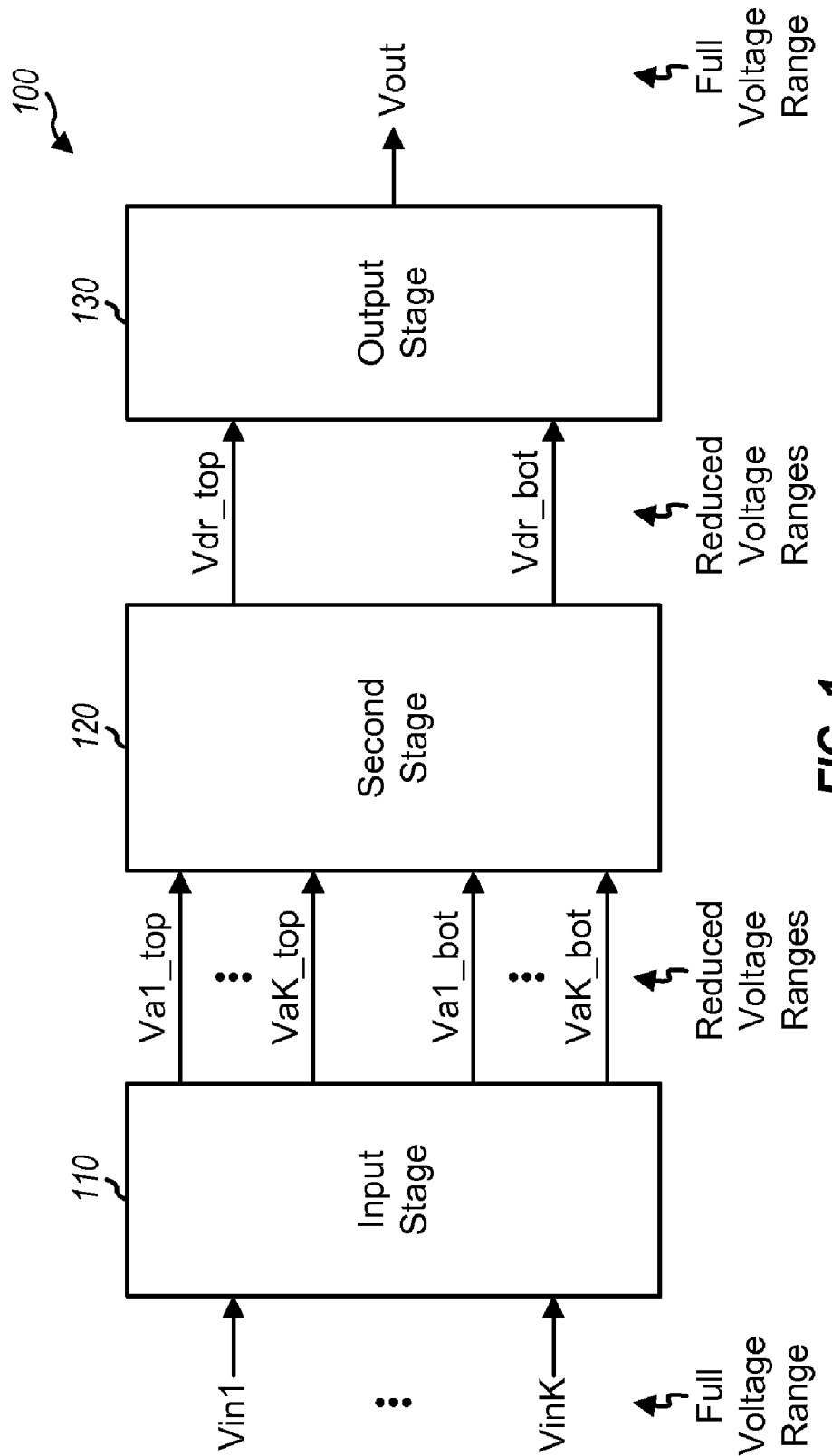
FIG. 1 shows a block diagram of a high voltage logic circuit.

FIG. 1 shows a block diagram of an exemplary design of a high voltage logic circuit 100. In this exemplary design, logic circuit 100 includes an input stage 110, a second stage 120 coupled to input stage 110, and an output stage 130 coupled to second stage 120. Input stage 110 may receive K digital input signals, Vin1 through VinK, having a full voltage range, where K may be one or greater. Input stage 110 may provide (i) K first digital intermediate signals, Va1_top through VaK_top, having a first reduced voltage range and (ii) K second digital intermediate signals, Va1_bot through VaK_bot, having a second reduced voltage range. Each reduced voltage range may be a fraction of the full voltage range.

Second stage 120 may receive the intermediate signals from input stage 110 and may implement a logic function on the intermediate signals. Second stage 120 may provide (i) a first digital drive signal, Vdr_top, having the first reduced voltage range and (ii) a second digital drive signal, Vdr_bot, having the second reduced voltage range. Output stage 130 may receive the drive signals from second stage 120 and may provide a digital output signal, Vout, having the full voltage range. Input stage 110, second stage 120, and output stage 130 may be implemented with MOS transistors having a breakdown voltage that may be smaller than the full voltage range but larger than each reduced voltage range, as described below.

Figure 2:
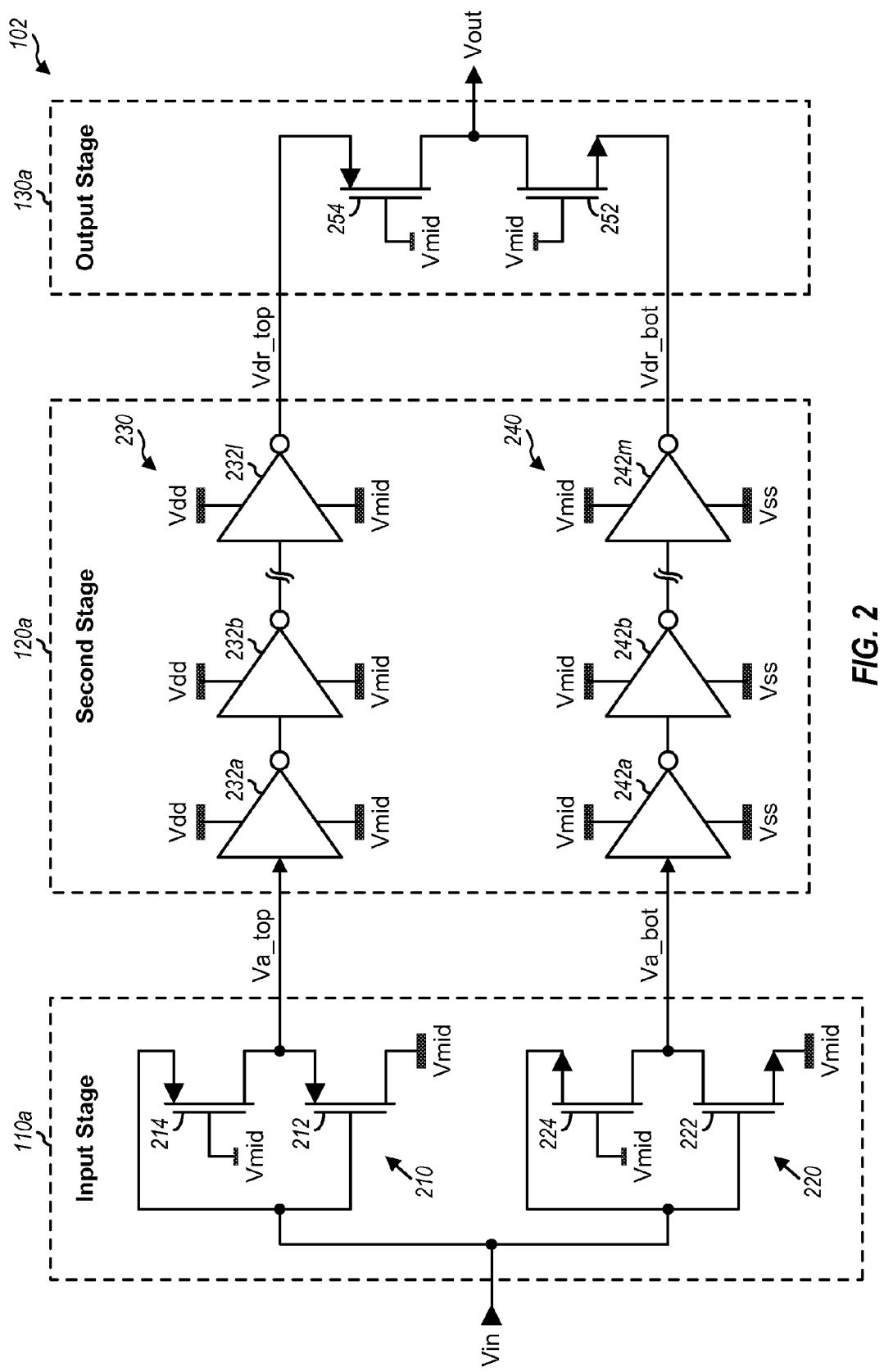
FIGS. 2 and 3 show high voltage logic circuits implementing an inverter.

FIG. 2 shows a schematic diagram of an exemplary design of a high voltage logic circuit 102, which implements an inverter. Logic circuit 102 comprises an input stage 110a, a second stage 120a, and an output stage 130a, which are an exemplary design of input stage 110, second stage 120, and output stage 130 in FIG. 1.

In the exemplary design shown in FIG. 2, input stage 110a includes a top input circuit 210 and a bottom input circuit 220. Top input circuit 210 receives an input signal, Vin, having the full voltage range and provides a first intermediate signal, Va_top, having the first reduced voltage range. Bottom input circuit 220 receives the Vin signal and provides a second intermediate signal, Va_bot, having the second reduced voltage range. In the exemplary design shown in FIG. 2, top input circuit 210 includes P-channel MOS (PMOS) transistors 212 and 214 coupled in a stack configuration. PMOS transistor 212 has its gate receiving the Vin signal, its drain coupled to a mid voltage, Vmid, and its source providing the Va_top signal. PMOS transistor 214 has its gate receiving the Vmid voltage, its drain coupled to the source of PMOS transistor 212, and its source receiving the Vin signal. Bottom input circuit 220 includes N-channel MOS (NMOS) transistors 222 and 224 coupled in a stack configuration. NMOS transistor 222 has its gate receiving the Vin signal, its source coupled to the Vmid voltage, and its drain providing the Va_bot signal. NMOS transistor 224 has its gate receiving the Vmid voltage, its drain coupled to the drain of NMOS transistor 222, and its source receiving the Vin signal. The PMOS and NMOS transistors may be implemented with symmetric structures, and the source and drain of each MOS transistor may be interchangeable.

The full voltage range for the Vin and Vout signals may cover a range from a positive power supply voltage, Vdd, to a negative power supply voltage, Vss. Vss may be circuit ground, a negative voltage, or a positive voltage. The first reduced voltage range for the Va_top signal may cover a range from Vdd to Vmid. The second reduced voltage range for the Va_bot signal may cover a range from Vmid to Vss. Each reduced voltage range may be less than the breakdown voltage of the MOS transistors used to implement the high voltage logic circuit. In general, Vmid may be any voltage between Vdd and Vss and may or may not be equal to Vcenter=(Vdd−Vss)/2+Vss. However, using Vcenter for Vmid may maximize the voltage range that can be handled by the high voltage logic circuit. The Vmid voltage may be set to a value near the mid-range of Vdd and Vss.

Top input circuit 210 generates the Va_top signal having the first reduced voltage range and the same logic value as the Vin signal. Bottom input circuit 220 generates the Va_bot signal having the second reduced voltage range and the same logic value as the Vin signal. Input stage 110a may effectively split the full voltage range into two reduced voltage ranges. As shown in FIG. 2, input circuits 210 and 220 are implemented with self-biasing MOS transistors. The Vin signal is used as a supply voltage for both input circuits 210 and 220.

Table 1 provides the on/off state of each MOS transistor within input stage 110a as well as the voltage levels of the Va_top and Va_bot signals versus the Vin signal. As shown in Table 1, the Va_top signal is limited between Vdd and Vmid, and the Va_bot signal is limited between Vmid and Vss. If the Vin signal is at Vdd, then the top PMOS transistor 214 is turned on, the bottom PMOS transistor 212 is turned off, and the Va_top signal is set to Vdd. Furthermore, the top NMOS transistor 224 is turned off, the bottom NMOS transistor 222 is turned on, and the Va_bot signal is set to Vmid. Conversely, if the Vin signal is at Vss, then the top PMOS transistor 214 is turned off, the bottom PMOS transistor 212 is turned on, and the Va_top signal is set to Vmid. Furthermore, the top NMOS transistor 224 is turned on, the bottom NMOS transistor 222 is turned off, and the Va_bot signal is set to Vss.

TABLE 1

| | Top Input Circuit 210 | | | | Bottom Input Circuit 220 | | |
|---|---|---|---|---|---|---|---|
| Vin | PMOS 214 | PMOS 212 | Va_top | Vin | NMOS 224 | NMOS 222 | Va_bot |
| Vdd | On | Off | Vdd | Vdd | Off | On | Vmid |
| Vss | Off | On | Vmid | Vss | On | Off | Vss |

The design of the second stage may be dependent on a logic function being implemented by the high voltage logic circuit. In the exemplary design shown in FIG. 2, second stage 120a implements an inverter function and includes a top path 230 and a bottom path 240. Top path 230 includes L inverters 232a through 232l coupled in series, where L may be an odd value of 1, 3, 5, etc., in order to implement the inverter function. The first inverter 232a receives the Va_top signal from top input circuit 210. Each inverter 232 (except for the last inverter 232l) provides its output to the next inverter 232. The last inverter 232l provides the first drive signal, Vdr_top. Inverters 232a through 232l may operate between Vdd and Vmid, as shown in FIG. 2.

Bottom path 240 includes M inverters 242a through 242m coupled in series, where M may be an odd value of 1, 3, 5, etc., in order to implement the inverter function. M may or may not be equal to L. The first inverter 242a receives the Va_bot signal from bottom input circuit 220. Each inverter 242 (except for the last inverter 242m) provides its output to the next inverter 242. The last inverter 242m provides the second drive signal, Vdr_bot. Inverters 242a through 242m may operate between Vmid and Vss, as shown in FIG. 2.

The top path 230 and the bottom path 240 may each include an odd number of inverters in order to implement the inverter function for logic circuit 102. Each inverter may be implemented with an NMOS transistor and a PMOS transistor, as described below.

Within output stage 130a, an NMOS transistor 252 has its gate coupled to the Vmid voltage, its source receiving the Vdr_bot signal from second stage 120a, and its drain providing the Vout signal. A PMOS transistor 254 has its gate coupled to the Vmid voltage, its source receiving the Vdr_top signal from second stage 120a, and its drain coupled to the drain of NMOS transistor 252. As shown in FIG. 2, output stage 130a is implemented with an inverter having its input connected to the Vmid voltage and its upper and lower supply voltages provided by the Vdr_top and Vdr_bot signals, respectively.

Table 2 provides the on/off state of each MOS transistor as well as the voltage levels of the Vout signal versus the drive signals. If the Vdr_top signal is at Vdd and the Vdr_bot signal is at Vmid, then NMOS transistor 252 is turned off, PMOS transistor 254 is turned on, and the Vout signal is set to Vdd. Conversely, if the Vdr_top signal is at Vmid and the Vdr_bot signal is at Vss, then NMOS transistor 252 is turned on, PMOS transistor 254 is turned off, and the Vout signal is set to Vss.

TABLE 2

Output Stage

| Vdr_top | Vdr_bot | NMOS 252 | PMOS 254 | Vout |
|---|---|---|---|---|
| Vdd | Vmid | Off | On | Vdd |
| Vmid | Vss | On | Off | Vss |

Figure 3:
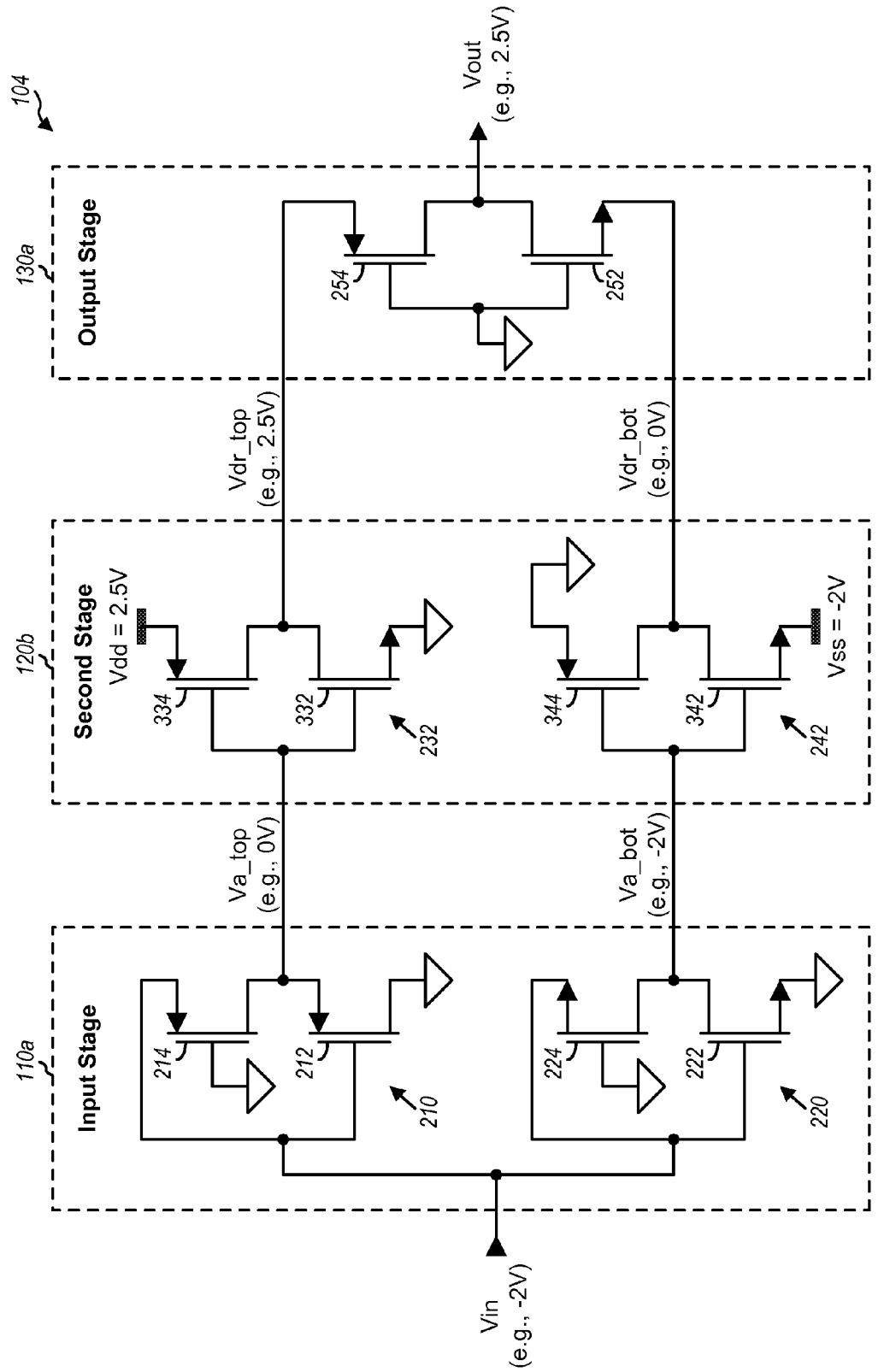

FIG. 3 shows a schematic diagram of an exemplary design of a high voltage logic circuit 104, which implements an inverter. Logic circuit 104 includes input stage 110a, a second stage 120b, and output stage 130a. Input stage 110a receives the input signal, Vin, and provides the intermediate signals, Va_top and Va_bot. Input stage 110a operates as described above for FIG. 2.

Second stage 120b receives the Va_top and Va_bot signals from input stage 110a and provides drive signals, Vdr_top and Vdr_bot. In the exemplary design shown in FIG. 3, second stage 120b includes one inverter 232 in the top path and one inverter 242 in the bottom path. Inverter 232 includes an NMOS transistor 332 and a PMOS transistor 334 coupled in a stacked configuration. NMOS transistor 332 has its gate receiving the Va_top signal, its source coupled to Vmid (e.g., circuit ground), and its drain providing the Vdr_top signal. PMOS transistor 334 has its gate receiving the Va_top signal, its source coupled to Vdd, and its drain coupled to the drain of NMOS transistor 332. Inverter 242 similarly includes an NMOS transistor 342 and a PMOS transistor 344 coupled in a stacked configuration. Inverter 232 receives the Va_top signal, implements an inverter function on the Va_top signal, and provides the Vdr_top signal. Inverter 242 receives the Va_bot signal, implements an inverter function on the Va_bot signal, and provides the Vdr_bot signal.

Output stage 130a receives the Vdr_top and Vdr_bot signals from second stage 120b and provides the output signal, Vout. Output stage 130a operates as described above for FIG. 2.

FIG. 3 also shows an example in which Vdd=2.5V, Vss=−2V, and Vmid=0V. As illustrated by this example, Vmid does not need to be at the mid point between Vdd and Vss. FIG. 3 also shows the voltage levels for various signals for the case in which the Vin signal is at logic low and has a voltage of Vss=−2V. In this case, the Va_top signal is also at logic low and has a voltage of Vmid=0V, and the Va_bot signal is also at logic low and has a voltage of Vss=−2V. Due to the inverter function, the Vdr_top signal is at logic high and has a voltage of Vdd=2.5V, and the Vdr_bot signal is also at logic high and has a voltage of Vmid=0V. The Vout signal is at logic high and has a voltage of Vdd=2.5V.

The Vdr_top and Vdr_bot signals from the second stage have the same logic value but may observe different delays. It may be desirable to control the transitions of the Vdr_top and Vdr_bot signals such that MOS transistors 252 and 254 in output stage 130a do not observe Vdd and Vss simultaneously, which may degrade reliability. For a high-to-low transition, the Vdr_top signal should transition from Vdd to Vmid first, and the Vdr_bot signal should transition from Vmid to Vss afterward. A faster high-to-low transition for the Vdr_top signal relative to the Vdr_bot signal may be obtained by using (i) a larger NMOS transistor 332 for inverters 232 in the top path and/or (ii) a smaller NMOS transistor 342 for inverter 242 in the bottom path. Conversely, for a low-to-high transition, the Vdr_bot signal should transition from Vss to Vmid first, and the Vdr_top signal should transition from Vmid to Vdd afterward. A faster low-to-high transition for the Vdr_bot signal relative to the Vdr_top signal may be obtained by using (i) a larger PMOS transistor 344 for inverter 242 in the bottom path and/or (ii) a smaller PMOS transistor 334 for inverter 232 in the top path. In general, the dimensions of the MOS transistors for inverter(s) 232 in the top path and inverter(s) 242 in the bottom path may be selected to achieve the desired low-to-high and high-to-low transitions for the Vdr_top and Vdr_bot signals.

In general, the number of inverters to include in each of the top and bottom paths as well as the dimensions of the MOS transistors for each inverter may be selected to obtain the desired transitions for the drive signals. The transitions for the drive signals may be defined to avoid driving MOS transistors 252 and 254 with Vdd and Vss simultaneously during switching, i.e., to avoid voltage spikes in the output stage.

Figure 4:
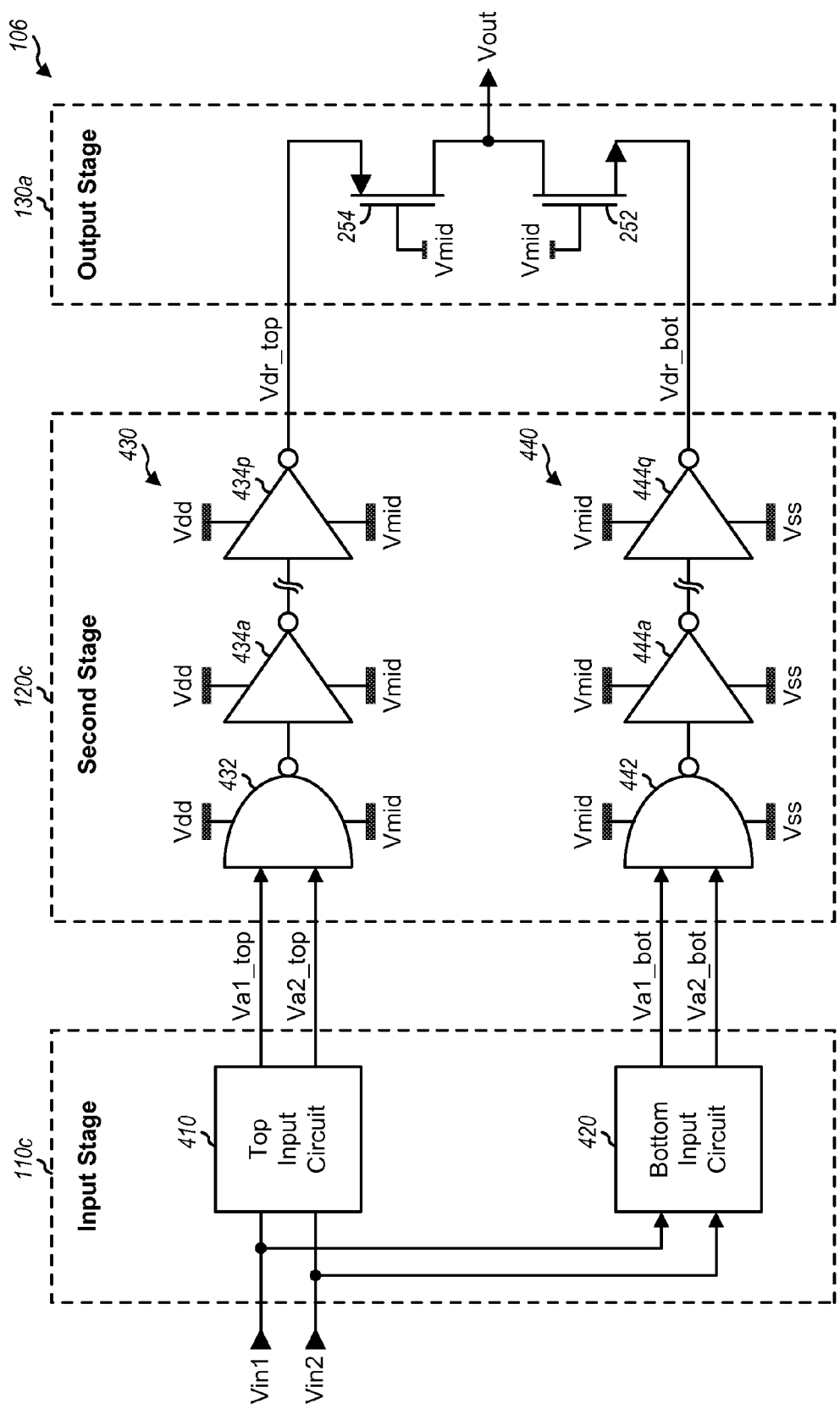
FIG. 4 shows a high voltage logic circuit implementing a NAND gate.

FIG. 4 shows a schematic diagram of an exemplary design of a high voltage logic circuit 106, which implements a two-input NAND gate. Logic circuit 106 includes an input stage 110c, a second stage 120c, and output stage 130a.

Input stage 110c includes a top input circuit 410 and a bottom input circuit 420. Top input circuit 410 receives two input signals, Vin1 and Vin2, and provides two first intermediate signals, Va1_top and Va2_top. Top input circuit 410 may be implemented with two input circuits 210 in FIG. 2, one input circuit 210 for each input signal. Bottom input circuit 420 receives the two input signals and provides two second intermediate signals, Va1_bot and Va2_bot. Bottom input circuit 420 may be implemented with two input circuits 220 in FIG. 2, one input circuit 220 for each input signal. The Vin1 and Vin2 signals have the full voltage range between Vdd and Vss. The Va1_top and Va2_top signals have the same logic values as the Vin1 and Vin2 signals, respectively, but have the first reduced voltage range between Vdd and Vmid. The Va1_bot and Va2_bot signals have the same logic values as the Vin1 and Vin2 signals, respectively, but have the second reduced voltage range between Vmid and Vss.

Second stage 120c implements an NAND function and includes a top path 430 and a bottom path 440. Top path 430 includes a NAND gate 432 and P inverters 434a through 434p coupled in series, where P may be an even value of 0, 2, 4, etc. NAND gate 432 receives the Va1_top and Va2_top signals from top input circuit 410 and provides its output to the first inverter 434a. Each inverter 434 (except for the last inverter 434p) provides its output to the next inverter 434. The last inverter 434p provides a first drive signal, Vdr_top. NAND gate 432 and inverters 434a through 434p may operate between Vdd and Vmid, as shown in FIG. 4. Bottom path 440 includes a NAND gate 442 and Q inverters 444a through 444q coupled in series, where Q may be an even value of 0, 2, 4, etc. Q may or may not be equal to P. NAND gate 442 receives the Va1_bot and Va2_bot signals from bottom input circuit 420 and provides its output to the first inverter 444a. Each inverter 444 (except for the last inverter 444q) provides its output to the next inverter 444. The last inverter 444q provides a second drive signal, Vdr_bot. NAND gate 442 and inverters 444a through 444q may operate between Vmid and Vss, as shown in FIG. 4.

NAND gates 432 and 442 may be implemented with MOS transistors in a manner known in the art. Second stage 120c may include inverters 434 and 444 to obtain the desired delay and low-to-high and high-to-low transitions for the drive signals, as described above. Inverters 434 and 444 may also be omitted. In this case, the desired delay and transitions may be obtained by using suitable dimensions for the MOS transistors used to implement NAND gates 432 and 442.

Output stage 130a receives the Vdr_top and Vdr_bot signals from second stage 120c and provides an output signal, Vout. Output stage 130a operates as described above for FIG. 4.

Figure 5:
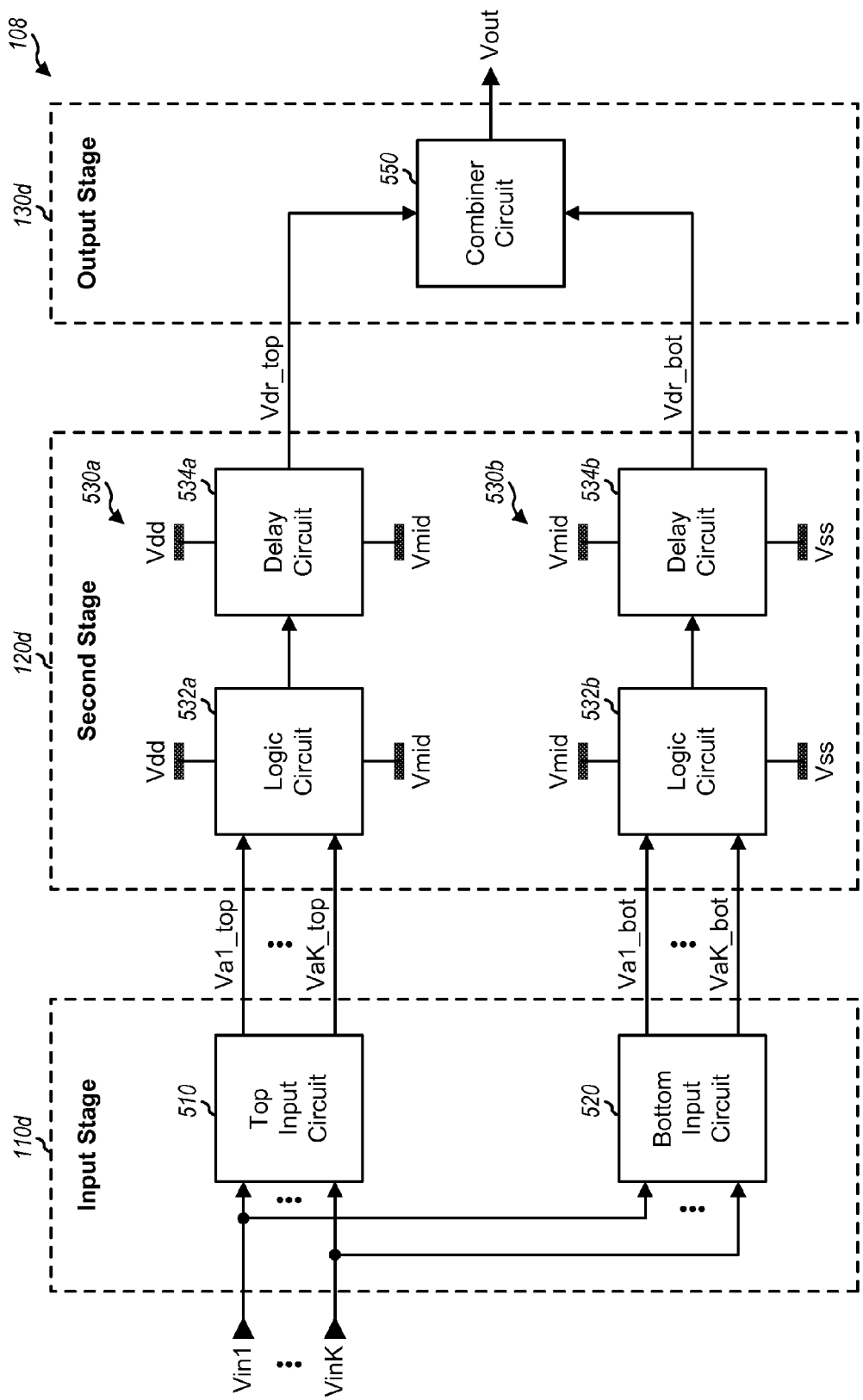
FIG. 5 shows a high voltage logic circuit implementing a logic function.

FIG. 5 shows a schematic diagram of an exemplary design of a high voltage logic circuit 108, which may be able to implement any logic function. Logic circuit 108 includes an input stage 110d, a second stage 120d, and an output stage 130d.

Input stage 110d includes a top input circuit 510 and a bottom input circuit 520. Top input circuit 510 receives K input signals, Vin1 through VinK, having the full voltage range and provides K first intermediate signals, Va1_top through VaK_top, having the first reduced voltage range and the same logic values as the Vin1 through VinK signals, respectively. Top input circuit 510 may be implemented with K input circuits 210 in FIG. 2, one input circuit 210 for each input signal. Bottom input circuit 520 also receives the Vin1 through VinK signals and provides K second intermediate signals, Va1_bot through VaK_bot, having the second reduced voltage range and the same logic values as the Vin1 through VinK signals, respectively. Bottom input circuit 520 may be implemented with K input circuits 220 in FIG. 2, one input circuit 220 for each input signal.

Second stage 120d includes a top path 530a and a bottom path 530b. Top path 530a includes a logic circuit 532a and a delay circuit 534a coupled in series. Bottom path 530b includes a logic circuit 532b and a delay circuit 534b coupled in series. Logic circuit 532a and delay circuit 534a in top path 530a may operate between Vdd and Vmid. Logic circuit 532b and delay circuit 534b in bottom path 530b may operate between Vmid and Vss. Each logic circuit 532 receives a respective set of K intermediate signals from input stage 110d, implements a desired logic function on the intermediate signals, and provides its output to an associated delay circuit 534. Each logic circuit 532 may be implemented with inverters, logic gates, and/or other logic components. Each delay circuit 534 operates on its input signal to obtain the desired delay and transitions and provides a drive signal. Logic circuits 532a and 532b may be implemented with similar (e.g., identical) circuits. Delay circuits 534a and 534b may be implemented with MOS transistors of suitable dimensions to obtain the desired delay and transitions in order to avoid voltage spikes in output stage 130d during switching. Delay circuits 534a and 534b may also be omitted. In this case, the desired delay and transitions may be achieved with logic circuits 532a and 532b.

Output stage 130d includes a combiner circuit 550 that receives the Vdr_top and Vdr_bot signals from second stage 120d and provides an output signal, Vout. Combiner circuit 550 may be implemented as shown in FIG. 2.

As shown in FIGS. 1 through 5, the high voltage logic circuits can handle input and output signals with the full voltage range and can implement any desired logic function. The high voltage logic circuits effectively split the full voltage range into multiple (e.g., two) reduced voltage ranges. A self-biasing input stage may split the full voltage range of the input signal(s) and may generate one set of intermediate signals for each reduced voltage range. A second stage may include one path for each reduced voltage range. Each path may implement the desired logic function and may operate between the voltages for its reduced voltage range. The paths in the second stage may operate in parallel. An output stage may combine the drive signals from the second stage and may provide an output signal having the full voltage range.

In the exemplary designs described above, the high voltage logic circuits may receive input signals having the full voltage range and may provide output signals having the full voltage range. In other exemplary designs, the high voltage logic circuits may receive input signals having a reduced voltage range and may provide output signals having the full voltage range. An input stage may include one or more level shifters to receive the input signals and provide multiple sets of intermediate signals having different reduced voltage ranges.

The high voltage logic circuits may be implemented with MOS transistors, e.g., as shown in FIGS. 2 through 5. Vdd, Vmid and Vss may be selected based on the following constraints:

$$Vdd - Vmid < Vbreakdown, \text{ and} \quad \text{Eq (1)}$$

$$Vmid - Vss < Vbreakdown, \quad \text{Eq (2)}$$

where Vbreakdown is the breakdown voltage of the MOS transistors.

Each MOS transistor may observe a maximum gate-to-source voltage (Vgs) and a maximum drain-to-source voltage (Vds) of a reduced voltage range (which may be either Vdd−Vmid or Vmid−Vss) instead of the full voltage range. The MOS transistors may operate reliably as long as each reduced voltage range is less than the breakdown voltage of the MOS transistors, as shown in equations (1) and (2).

The high voltage logic circuits can operate with different combinations of power supply voltages. For example, the high voltage logic circuits can operate with both positive and negative supply voltages (e.g., Vdd=3V, Vss=−3V, and Vmid=0V), or only positive supply voltages (e.g., Vdd=6V, Vss=0V, and Vmid=3V), or only negative supply voltages (e.g., Vdd=0V, Vss=−6V, and Vmid=−3V).

The high voltage logic circuits may provide various advantages. These logic circuits can handle input and output signals with large voltage levels that may exceed the breakdown voltage of the MOS transistors used to implement the logic circuits. These logic circuits can interface with circuit blocks (e.g., switches) requiring large voltage levels exceeding the breakdown voltage. For example, switches with source/drain biased at 0V may require Vdd to be turned on and Vss to be turned off. In this case, Vdd−Vss may be greater than Vbreakdown. As another example, switches with source at Vdd may require 2Vdd to be turned on and 0V to be turned off. In this case, 2Vdd may be greater than Vbreakdown. The high voltage logic circuits may be able to withstand the high voltage levels of these switches.

The high voltage logic circuits described herein may be used for various electronics devices such as wireless communication devices, cellular phones, personal digital assistants (PDAs), handheld devices, wireless modems, laptop computers, cordless phones, broadcast receivers, Bluetooth devices, consumer electronics devices, etc. The use of the high voltage logic circuits in a wireless communication device, which may be a cellular phone or some other device, is described below.

Figure 6:
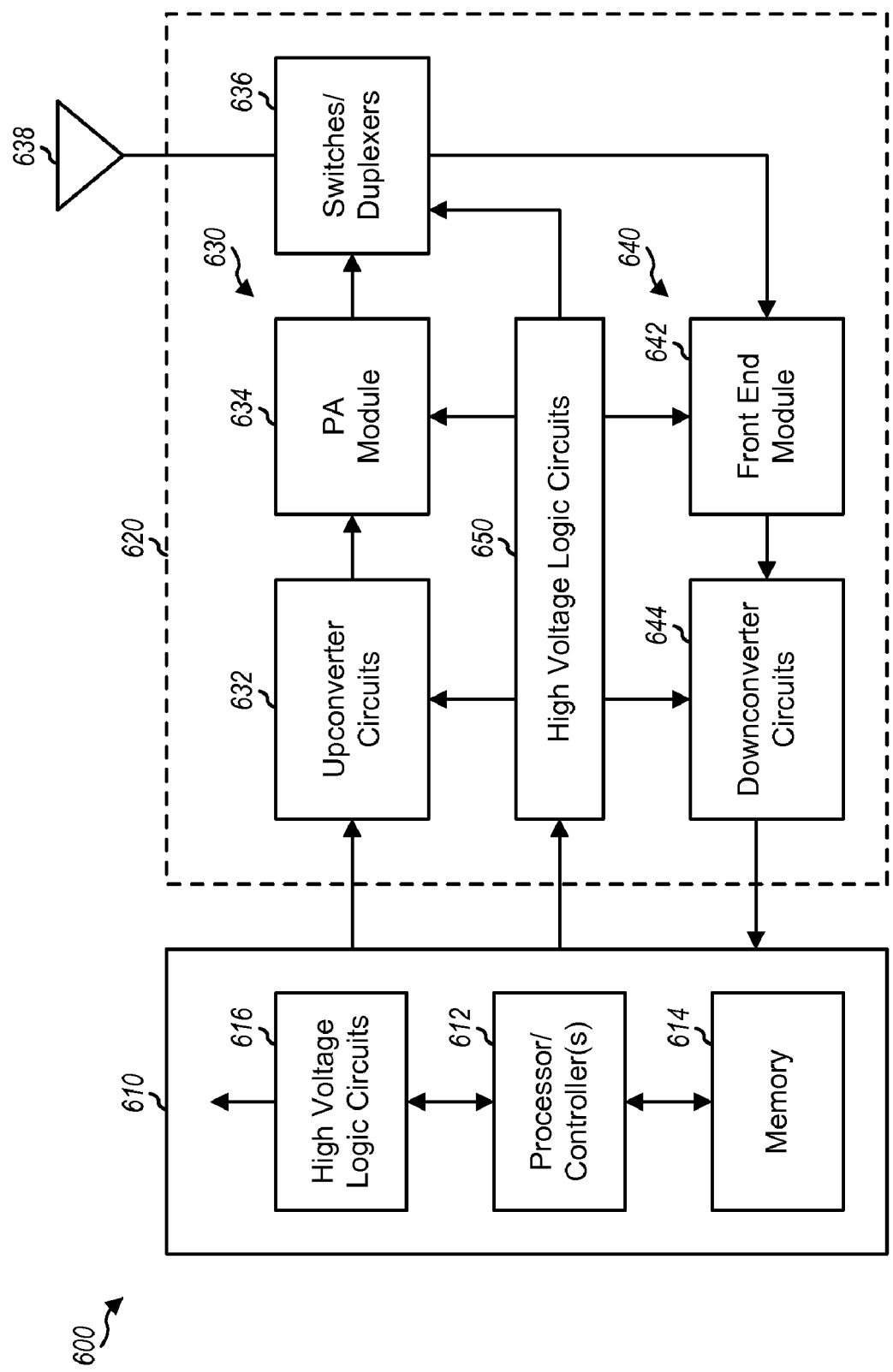
FIG. 6 shows a block diagram of a wireless communication device.

FIG. 6 shows a block diagram of an exemplary design of a wireless communication device 600. In this exemplary design, wireless device 600 includes a digital section 610 and a transceiver 620. Transceiver 620 includes a transmitter 630 and a receiver 640 that support bi-directional communication.

Within digital section 610, processor/controller(s) 612 may perform various functions for wireless device 600, e.g., processing for data being transmitted or received. A memory 614 may store program codes and data for processor/controller(s) 612. High voltage logic circuits 616 may receive input signals, e.g., from processor/controller(s) 612 and/or other circuit blocks, and may generate output signals. Digital section 610 may also include other modules, processors, memories, etc.

In the transmit path, digital section 610 may process (e.g., encode and modulate) data to be transmitted and provide an output baseband signal to transmitter 630. Within transmitter 630, upconverter circuits 632 may process (e.g., amplify, filter, and frequency upconvert) the output baseband signal and provide an upconverted signal. A power amplifier (PA) module 634 may amplify the upconverted signal to obtain the desired output power level and provide an output radio frequency (RF) signal, which may be routed through switches/duplexers 636 and transmitted via an antenna 638.

In the receive path, antenna 638 may receive RF signals transmitted by base stations and/or other transmitter stations and may provide a received RF signal, which may be routed via switches/duplexers 636 and provided to receiver 640. Within receiver 640, a front end module 642 may process (e.g., amplify and filter) the received RF signal and provide an amplified RF signal. Downconverter circuits 644 may further process (e.g., frequency downconvert, filter, and amplify) the amplified RF signal and provide an input baseband signal to digital section 610. Digital section 610 may further process (e.g., digitize, demodulate, and decode) the input baseband signal to recover transmitted data.

High voltage logic circuits 650 may receive input signals from digital section 610 and may generate output signals for upconverter circuits 632, PA module 634, switches/duplexers 636, front end module 642, and/or downconverter circuits 644. For example, logic circuits 650 may generate control signals for switches within PA module 634 and switches/duplexers 636.

Figure 7:
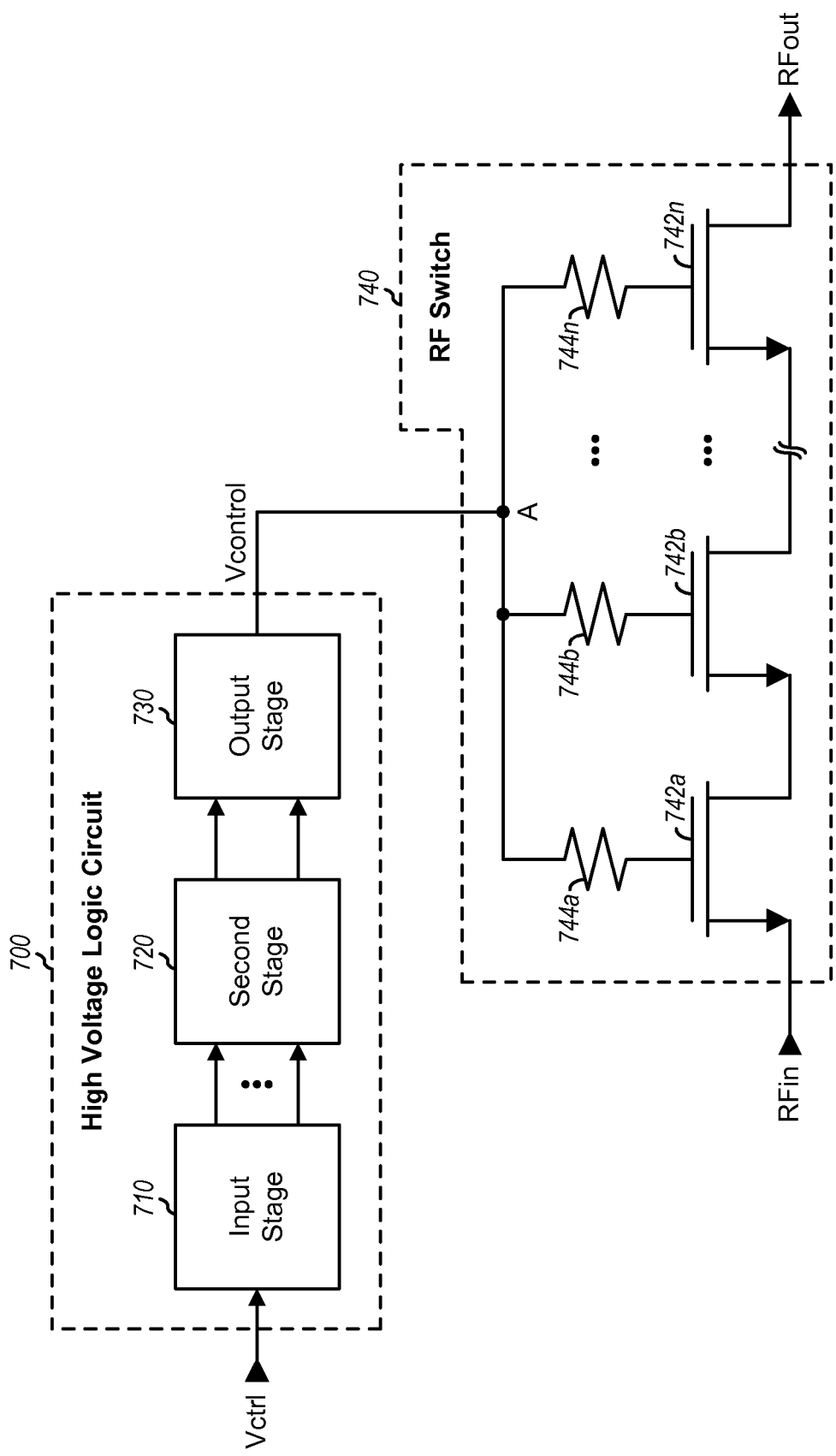
FIG. 7 shows a high voltage logic circuit and a switch.

FIG. 7 shows a schematic diagram of an exemplary design of a high voltage logic circuit 700 and an RF switch 740. In the exemplary design shown in FIG. 7, switch 740 is implemented with stacked NMOS transistors. Within switch 740, N NMOS transistors 742a through 742n are coupled in a stacked configuration, where N may be any integer value greater than one. Each NMOS transistor 742 (except for the last NMOS transistor 742n) has its drain coupled to the source of a following NMOS transistor. The first NMOS transistor 742a has its source receiving an input RF signal, RFin. The last NMOS transistor 742n has its drain providing an output RF signal, RFout. N resistors 744a through 744n have one end coupled to node A and the other end coupled to the gate of NMOS transistors 742a through 742n, respectively. Resistors 744a through 744n may have the same resistor value, which may be relatively large, e.g., more than one kilo Ohm. Node A is a control input of switch 740.

High voltage logic circuit 700 may receive an input control signal, Vctrl, and may provide an output control signal, Vcontrol, to the control input of switch 740. Logic circuit 700 may include an input stage 710, a second stage 720, and an output stage 730, which may be implemented as described above. For example, logic circuit 700 may be implemented with logic circuit 102 in FIG. 2, logic circuit 104 in FIG. 3, logic circuit 106 in FIG. 4, or logic circuit 108 in FIG. 5.

In an exemplary design, an apparatus may comprise an input stage, a second stage, and an output stage, e.g., as shown in FIG. 1. The input stage may receive at least one input signal (e.g., Vin1 through VinK, where K≧1) and may provide (i) at least one first intermediate signal (e.g., Va1_top through VaK_top) having a first voltage range and (ii) at least one second intermediate signal (e.g., Va1_bot through VaK_bot) having a second voltage range. The second stage may be coupled to the input stage, may receive and process the first and second intermediate signals based on a logic function, and may provide a first drive signal (e.g., Vdr_top) having the first voltage range and a second drive signal (Vdr_bot) having the second voltage range. The output stage may be coupled to the second stage, may receive the first and second drive signals, and may provide an output signal having a third voltage range. The third voltage range may be larger than each of the first and second voltage ranges.

The at least one input signal may also have the third voltage range. The voltage difference between the first and second drive signals may be equal to the first voltage range or the second voltage range. In an exemplary design, the first voltage range may be between a high voltage and a mid voltage. The second voltage range may be between the mid voltage and a low voltage. The third voltage range may be between the high voltage and the low voltage. The input stage, the second stage, and the output stage may be implemented with MOS transistors having a breakdown voltage. The first and second voltage ranges may be less than the breakdown voltage to improve reliability of the MOS transistors.

In an exemplary design, the input stage may comprise first and second circuits. The first input circuit (e.g., input circuit 210, 410, or 510) may receive the at least one input signal and may provide the at least one first intermediate signal. The first input circuit may comprise at least one pair of PMOS transistors, one pair of PMOS transistors for each input signal. Each pair of PMOS transistors (e.g., PMOS transistors 212 and 214) may be coupled in a stack configuration and may receive a respective input signal and provide a respective first intermediate signal. The second input circuit (e.g., input circuit 220, 420, or 520) may also receive the at least one input signal and may provide the at least one second intermediate signal. The second input circuit may comprise at least one pair of NMOS transistors, one pair of NMOS transistors for each input signal. Each pair of NMOS transistors (e.g., NMOS transistors 222 and 224) may be coupled in a stack configuration and may receive a respective input signal and provide a respective second intermediate signal. The first input circuit may operate between the high voltage and the mid voltage. The second input circuit may operate between the mid voltage and the low voltage.

In an exemplary design, the second stage may comprise first and second logic circuits. The first logic circuit (e.g., logic circuit 532*a*) may receive and process the at least one first intermediate signal based on the logic function and may operate between the first voltage range. The second logic circuit (e.g., logic circuit 532*b*) may receive and process the at least one second intermediate signal based on the logic function and may operate between the second voltage range. The first and second logic circuits may each comprise at least one inverter (e.g., inverter 232 or 242), or at least one logic gate (e.g., NAND gate 432 or 442), some other logic component, or any combination thereof. The second stage may further comprise first and second delay circuits. The first delay circuit (e.g., delay circuit 534*a*) may receive an output of the first logic circuit and may provide the first drive signal. The second delay circuit may receive an output of the second logic circuit and may provide the second drive signal. Each delay circuit may comprise at least one inverter and/or other logic gate or component.

In an exemplary design, the output stage may comprise a PMOS transistor coupled to an NMOS transistor, e.g., as shown in FIG. 2. The PMOS transistor may receive the first drive signal at its source and may provide the output signal at its drain. The NMOS transistor may receive the second drive signal at its source and may provide the output signal at its drain. The first and second drive signals may have a common logic value. For a change from logic high to logic low, the first drive signal may transition to logic low prior to the second drive signal. For a change from logic low to logic high, the second drive signal may transition to logic high prior to the first drive signal. This may be achieved by selecting proper dimensions for MOS transistors in the delay circuits and/or the logic circuits.

The apparatus may further comprise a switch. The switch may receive an RF signal and may either pass or block the RF signal based on the output signal from the output stage. The output signal may also be provided to other circuit blocks.

In another exemplary design, an apparatus (e.g., a wireless device, an integrated circuit, etc.) may comprise a high voltage logic circuit and a second circuit. The high voltage logic circuit may receive at least one input signal and may generate (i) at least one first intermediate signal having a first voltage range and (ii) at least one second intermediate signal having a second voltage range, based on the at least one input signal and in accordance with a logic function. The high voltage logic circuit may provide a control signal having a third voltage range that may be larger than each of the first and second voltage ranges. The second circuit may receive the control signal and may operate in accordance with the control signal. For example, the second circuit may comprise a switch that may be turned on or off based on the control signal.

Figure 8:
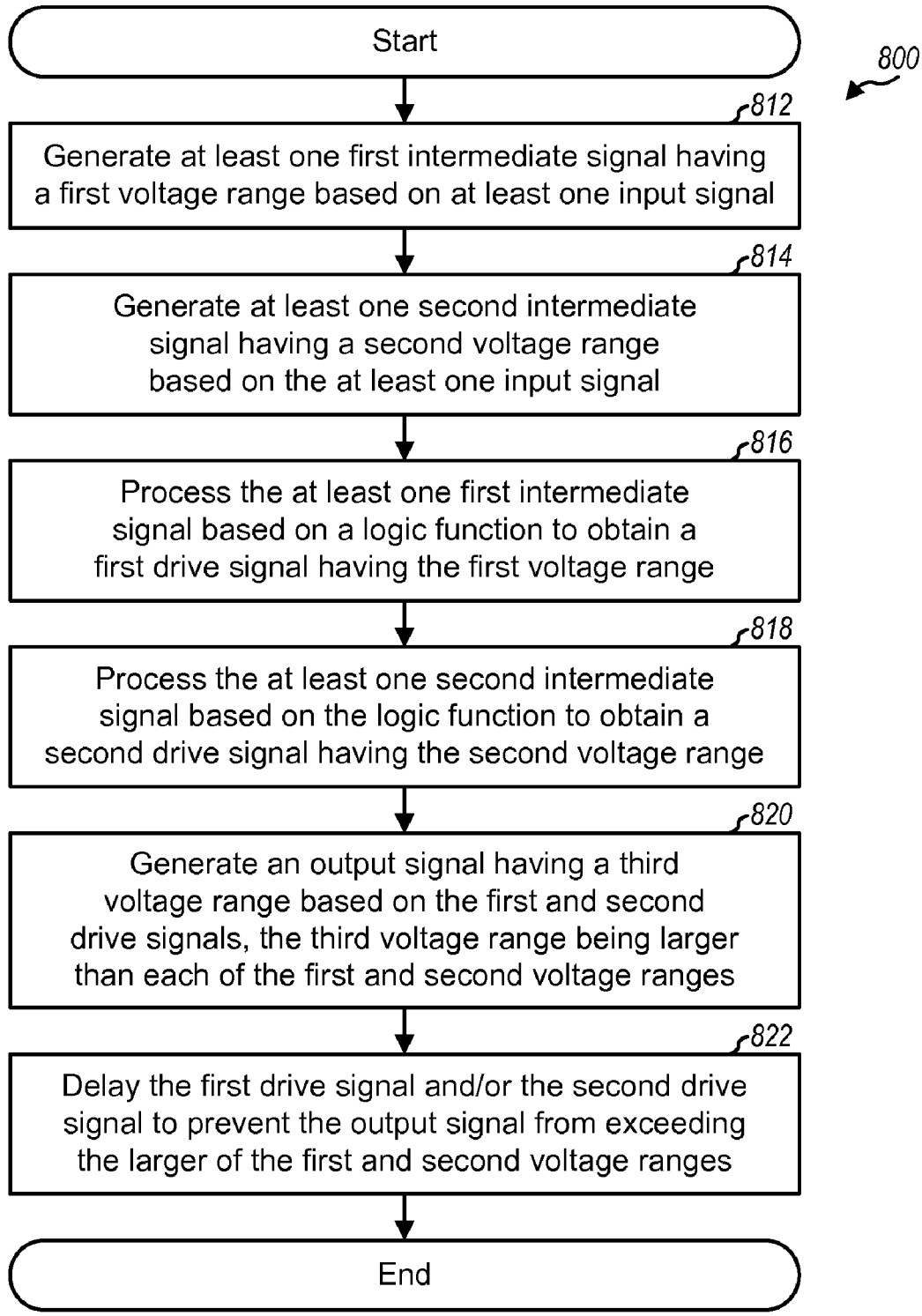
FIG. 8 shows a process for generating a control signal.

FIG. 8 shows an exemplary design of a process 800 for generating a control signal. At least one first intermediate signal having a first voltage range may be generated based on at least one input signal, e.g., with a first input circuit operating between a high voltage of the at least one input signal and a mid voltage (block 812). At least one second intermediate signal having a second voltage range may be generated based on the at least one input signal, e.g., with a second input circuit operating between the mid voltage and a low voltage of the at least one input signal (block 814). The at least one first intermediate signal may be processed based on a logic function (e.g., with a first logic circuit operating between the first voltage range) to obtain a first drive signal having the first voltage range (block 816). The at least one second intermediate signal may also be processed based on the logic function (e.g., with a second logic circuit operating between the second voltage range) to obtain a second drive signal having the second voltage range (block 818). An output signal having a third voltage range may be generated based on the first and second drive signals, e.g., with an output stage operating between the first and second drive signals (block 820). The third voltage range may be larger than each of the first and second voltage ranges. The first and/or second drive signal may be delayed to prevent the output signal from exceeding the larger of the first and second voltage ranges (block 822). A switch or some other circuit may be controlled with the output signal.

The high voltage logic circuits described herein may be implemented on an IC, an analog IC, an RFIC, a mixed-signal IC, an application specific integrated circuit (ASIC), a printed circuit board (PCB), an electronics device, etc. The high voltage logic circuits may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the high voltage logic circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
an input stage to receive at least one input signal and to provide at least one first intermediate signal having a first voltage range and at least one second intermediate signal having a second voltage range;
a second stage to receive and process the first and second intermediate signals based on a logic function and to provide a first drive signal having the first voltage range and a second drive signal having the second voltage range; and
an output stage to receive the first and second drive signals and to provide an output signal having a third voltage range, the third voltage range being larger than each of the first and second voltage ranges.

2. The apparatus of claim 1, the input stage comprising
a first input circuit to receive the at least one input signal and to provide the at least one first intermediate signal, and
a second input circuit to receive the at least one input signal and to provide the at least one second intermediate signal.

3. The apparatus of claim 2, the first input circuit comprising at least one pair of P-channel metal oxide semiconductor (PMOS) transistors, one pair of PMOS transistors for each input signal, each pair of PMOS transistors is coupled in a stack configuration and receives a respective input signal and provides a respective first intermediate signal, and
the second input circuit comprising at least one pair of N-channel metal oxide semiconductor (NMOS) transistors, one pair of NMOS transistors for each input signal, each pair of NMOS transistors is coupled in a stack configuration and receives a respective input signal and provides a respective second intermediate signal.

4. The apparatus of claim 2, the first input circuit operates between a high voltage of the at least one input signal and a mid voltage, and the second input circuit operates between the mid voltage and a low voltage of the at least one input signal.

5. The apparatus of claim 1, the second stage comprising
a first logic circuit to receive and process the at least one first intermediate signal based on the logic function, the first logic circuit operates between the first voltage range, and
a second logic circuit to receive and process the at least one second intermediate signal based on the logic function, the second logic circuit operates between the second voltage range.

6. The apparatus of claim 5, the first and second logic circuits each comprises at least one inverter, or at least one logic gate, or both.

7. The apparatus of claim 5, the second stage further comprising
a first delay circuit to receive an output of the first logic circuit and to provide the first drive signal, and
a second delay circuit to receive an output of the second logic circuit and to provide the second drive signal.

8. The apparatus of claim 7, the first and second delay circuits each comprises at least one inverter.

9. The apparatus of claim 1, the output stage comprising
a P-channel metal oxide semiconductor (PMOS) transistor to receive the first drive signal at a source and to provide the output signal at a drain, and
an N-channel metal oxide semiconductor (NMOS) transistor coupled to the PMOS transistor and to receive the second drive signal at a source and to provide the output signal at a drain.

10. The apparatus of claim 1, a voltage difference between the first and second drive signals is equal to the first voltage range or the second voltage range.

11. The apparatus of claim 1, the first and second drive signals have a common logic value and, for a change from logic high to logic low, the first drive signal transitions to logic low prior to the second drive signal.

12. The apparatus of claim 1, the first and second drive signals have a common logic value and, for a change from logic low to logic high, the second drive signal transitions to logic high prior to the first drive signal.

13. The apparatus of claim 1, the at least one input signal has the third voltage range.

14. The apparatus of claim 1, the first voltage range is between a high voltage and a mid voltage, the second voltage range is between the mid voltage and a low voltage, and the third voltage range is between the high voltage and the low voltage.

15. The apparatus of claim 1, the input stage, the second stage, and the output stage are implemented with metal oxide semiconductor (MOS) transistors having a breakdown voltage, and the first and second voltage ranges are less than the breakdown voltage.

16. The apparatus of claim 1, further comprising:
a switch to receive a radio frequency (RF) signal and to pass or block the RF signal based on the output signal.

17. An apparatus comprising:
a logic circuit to receive at least one input signal, to generate at least one first intermediate signal having a first voltage range and at least one second intermediate signal having a second voltage range based on the at least one input signal and in accordance with a logic function, and to provide a control signal having a third voltage range larger than each of the first and second voltage ranges; and
a second circuit to receive the control signal and to operate in accordance with the control signal.

18. The apparatus of claim 17, the second circuit comprises a switch being turned on or off based on the control signal.

19. A method comprising:
generating at least one first intermediate signal having a first voltage range based on at least one input signal;
generating at least one second intermediate signal having a second voltage range based on the at least one input signal;
processing the at least one first intermediate signal based on a logic function to obtain a first drive signal having the first voltage range;
processing the at least one second intermediate signal based on the logic function to obtain a second drive signal having the second voltage range; and
generating an output signal having a third voltage range based on the first and second drive signals, the third voltage range being larger than each of the first and second voltage ranges.

20. The method of claim 19, the generating the at least one first intermediate signal comprises generating the at least one first intermediate signal with a first input circuit operating between a high voltage of the at least one input signal and a mid voltage, and
the generating the at least one second intermediate signal comprises generating the at least one second intermediate signal with a second input circuit operating between the mid voltage and a low voltage of the at least one input signal.

21. The method of claim 19, the processing the at least one first intermediate signal comprises processing the at least one first intermediate signal with a first logic circuit operating between the first voltage range, and
the processing the at least one second intermediate signal comprises processing the at least one second intermediate signal with a second logic circuit operating between the second voltage range.

22. The method of claim 19, further comprising:
delaying the first drive signal, or the second drive signal, or both drive signals to prevent the output signal from exceeding the larger of the first and second voltage ranges.

23. The method of claim 19, the generating the output signal comprises
generating the output signal with an output stage operating between the first and second drive signals.

24. The method of claim 19, further comprising:
controlling a switch with the output signal.

25. An apparatus comprising:
means for generating at least one first intermediate signal having a first voltage range based on at least one input signal;
means for generating at least one second intermediate signal having a second voltage range based on the at least one input signal;
means for processing the at least one first intermediate signal based on a logic function to obtain a first drive signal having the first voltage range;
means for processing the at least one second intermediate signal based on the logic function to obtain a second drive signal having the second voltage range; and
means for generating an output signal having a third voltage range based on the first and second drive signals, the third voltage range being larger than each of the first and second voltage ranges.

* * * * *